(12) United States Patent
Launay et al.

(10) Patent No.: US 8,870,076 B2
(45) Date of Patent: Oct. 28, 2014

(54) SMART CARD PRODUCING METHOD AND A SMART CARD IN PARTICULAR PROVIDED WITH A MAGNETIC ANTENNA

(75) Inventors: François Launay, Epron (FR); Jacques Venambre, Ifs (FR); Yann Limelette, Rennes (FR); Aurélie Barbotin, Rennes (FR)

(73) Assignee: Oberthur Technologies, Colombes (FR)

( * ) Notice: Subject to any disclaimer, the term of this patent is extended or adjusted under 35 U.S.C. 154(b) by 1431 days.

(21) Appl. No.: 12/092,994

(22) PCT Filed: Nov. 2, 2006

(86) PCT No.: PCT/FR2006/002450
§ 371 (c)(1),
(2), (4) Date: May 8, 2008

(87) PCT Pub. No.: WO2007/054632
PCT Pub. Date: May 18, 2007

(65) Prior Publication Data
US 2008/0277484 A1 Nov. 13, 2008

(30) Foreign Application Priority Data
Nov. 8, 2005 (FR) ...................................... 05 11338

(51) Int. Cl.
*G06K 19/06* (2006.01)
*G06K 19/077* (2006.01)

(52) U.S. Cl.
CPC . *G06K 19/07749* (2013.01); *H01L 2224/83192* (2013.01); *H01L 2924/01025* (2013.01); *H01L 2224/32225* (2013.01); *G06K 19/07779* (2013.01); *H01L 2224/73204* (2013.01); *H01L 2224/16227* (2013.01); *H01L 2224/16* (2013.01); *G06K 19/07783* (2013.01); *H01L 2224/16225* (2013.01); *G06K 19/07767* (2013.01); *G06K 19/0775* (2013.01); *H01L 2924/01087* (2013.01)
USPC .......................................................... 235/492

(58) Field of Classification Search
USPC ................................................. 235/488, 492
See application file for complete search history.

(56) References Cited

U.S. PATENT DOCUMENTS

| | | | |
|---|---|---|---|
| 6,203,655 B1 * | 3/2001 | Fujikawa et al. | 156/272.8 |
| 6,293,470 B1 * | 9/2001 | Asplund | 235/487 |
| 7,663,564 B2 | 2/2010 | Ayala et al. | |
| 2001/0030238 A1 * | 10/2001 | Arisawa | 235/492 |

FOREIGN PATENT DOCUMENTS

| | | |
|---|---|---|
| DE | 196 46 209 A1 | 5/1997 |
| DE | 197 09 985 A1 | 9/1998 |
| DE | 100 64 411 A1 | 6/2002 |
| EP | 0 920 056 A2 | 6/1999 |
| EP | 0 952 542 A1 | 10/1999 |
| EP | 1 031 939 A1 | 8/2000 |
| EP | 1 107 175 A2 | 6/2001 |
| FR | 2769390 | 4/1999 |
| WO | 2005064533 | 7/2005 |
| WO | 2007054631 | 5/2007 |

* cited by examiner

*Primary Examiner* — Seung Lee
(74) *Attorney, Agent, or Firm* — Young & Thompson

(57) ABSTRACT

A smart card comprises a magnetic antenna consisting of first (26) and second (28) coils. The card embossing area (24) is arranged outside of the first coil (26) and inside the second coil (28). A smart card producing method is also disclosed.

21 Claims, 5 Drawing Sheets

SMART CARD PRODUCING METHOD AND A SMART CARD IN PARTICULAR PROVIDED WITH A MAGNETIC ANTENNA

FIELD OF THE INVENTION

The invention concerns a microcircuit card fabrication method. This method is particularly interesting in the case of contactless cards, in particular because it allows a low production cost. The invention is also directed to a card including a magnetic antenna.

BACKGROUD OF THE INVENTION

The expansion of contactless tags for radio-frequency identification and tracking applications has led to the development of very low cost technologies using flip-chip processes to transfer chips. The generalization of this technique to microcircuit cards (or chip cards), in particular for identity or banking type markets, has run into problems of reliability limiting their use to microcircuits of small size (1 or 2 mm$^2$), and consequently of limited performance incompatible with high-security applications.

The source of these problems is the sensitivity of the flip-chip process to the pressures and temperatures used during lamination of the plastic structures and mechanical bending, twisting and pressure stresses exerted on the cards during their use in the field.

The faults encountered are typically related to the electronic chip breaking and/or its disconnection from the antenna. The present invention proposes to remedy these problems by defining a relatively inexpensive process for obtaining the levels of reliability required by microcircuit card applications, in particular those using a microprocessor.

SUMMARY OF THE INVENTION

With this aim in particular, the invention proposes a method of producing a microcircuit card comprising the following steps:
depositing the microcircuit on a surface carrying at least one connecting land with an adhesive between them,
hot lamination with a given maximum temperature of at least one compensation layer attached to said surface,
characterized in that the adhesive is viscous at said maximum temperature.

This prevents excessive creep of the adhesive during lamination, which would entail the risk of breaking the connections between the land and the microcircuit.

To this end, one solution is to choose the adhesive such that its softening temperature and said maximum temperature differ by 40° C. or less. The softening temperature of the adhesive is lower than said maximum temperature, for example.

In one embodiment, the adhesive is a heat-set glue. In this case, the softening temperature of the adhesive can be considered to be equal to the glass transition temperature of the glue, which enables that temperature to be determined precisely.

According to another aspect, possibly independent of the preceding aspect, the microcircuit can have a thickness in a direction essentially perpendicular to said surface of less than 160 µm in order not to be damaged by bending forces to which the card is subjected. Said thickness is preferably greater than 120 µm, however, in order to preserve sufficient stiffness.

By way of comparison, the microcircuit card according to the ISO 7816 standard has a thickness between 680 µm and 840 µm.

The process is of the flip-chip type, for example, i.e. at least one contact of the microcircuit is located facing said connecting land with a conductive member disposed between them.

The invention also proposes, in a manner that is novel in itself and independent of the foregoing considerations, a microcircuit card comprising a magnetic antenna formed of a first winding comprising at least one turn and a second winding comprising at least one turn, characterized in that an embossing area of the card is located outside the first winding and inside the second winding.

This optimizes the equivalent area of the antenna despite the presence of the embossing area.

In an embodiment, the first winding and the second winding are connected in series.

The second winding is located at the periphery of the microcircuit card, for example, while the first winding can be located in a rectangular portion of the microcircuit card located outside the embossing area. This solution is particularly well adapted to the structure of the card. Said rectangular portion is that which carries the microcircuit, for example.

BRIEF DESCRIPTION OF THE DRAWINGS

Examples of the invention will now be described with reference to the following drawings, in which:

FIG. 1 shows diagrammatically in cross section the structure of a microcircuit card conforming to the teachings of the invention. In this representation, the thickness dimensions are exaggerated relative to the transverse dimensions to facilitate perception of the various layers.

Figure 1:
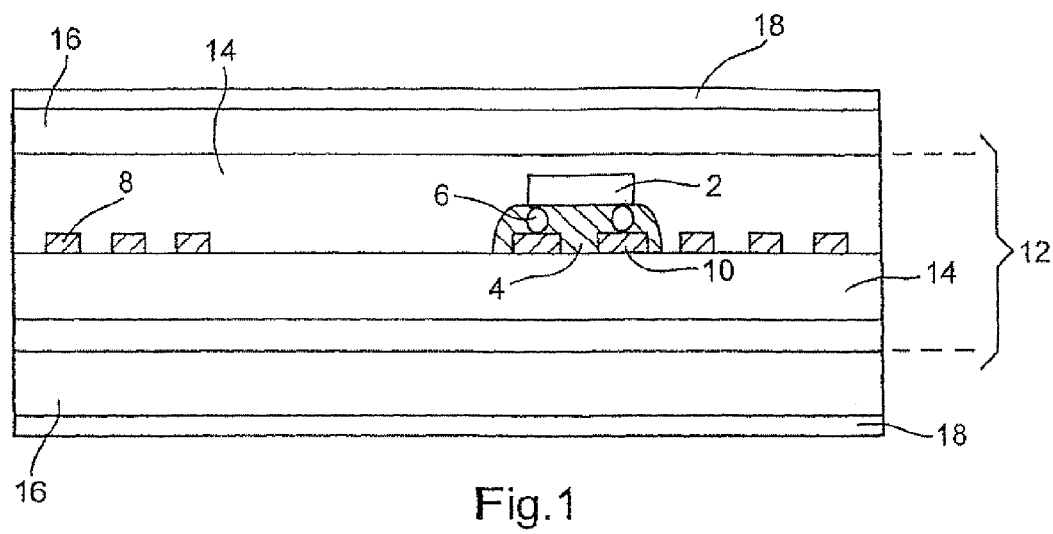
FIG. 1 is a cross section of a microcircuit card conforming to the invention, FIG. 2 discloses a first step of a fabrication process of a microcircuit conforming to the invention, FIG. 3 discloses a further step including production of conductive bumps, FIG. 4 discloses a further step including deposition of a glue deposition, FIG. 5 discloses a further step including pressing lands of the antenna against the bumps, FIG. 6 discloses a further step including providing compensating layers, FIG. 7 discloses a further step including lamination, FIG. 8 discloses a further step including assembling with further layers, FIG. 9 discloses an antenna design, FIG. 10 discloses another possible antenna design, FIG. 11 discloses a perforated structure possibly obtained after the step of FIG. 6, FIG. 12 discloses another structure possibly obtained after the step of FIG. 6, and FIG. 13 discloses another structure possibly obtained after the step of FIG. 7.

In this card, an antenna 8 is deposited on a flexible film (support) 3 between 40 and 100 µm thick in order to limit the phenomena of deformation (or scaling) during the operation of laminating the plastic structure with different materials such as PVC. This support 3 is compatible with the temperatures used during production of the flip-chip structure and typically must therefore resist temperatures greater than 100° C., failing which the microcircuit 2 would tend to be pressed into the material during the transfer operation and thus break the connecting lands or the turns of the antenna. To this end, the support 3 is made from PET (polyethylene terephthalate), for example.

An adhesive 4, here an insulative (or alternatively anisotropic) glue, is deposited as described hereinafter at the place where the microcircuit 2 is transferred onto the support 3 of the antenna 8. The glue 4 used has a softening temperature (which corresponds in the case of a heat-set glue, for example of epoxy type, to the glass transition temperature) that is not more than 40° C. lower than the maximum temperature of the hot lamination cycle of the plastic structure. The MK055 glue from the company DELO is used for this purpose, for example. This is a heat-set glue whose glass transition temperature is 115° C. according to the DSC (Differential Scanning Calorimetry) method.

Alternatively, the adhesive could be an adhesive film based on thermoplastic materials whose softening temperature depends on the glass transition temperatures of its components.

The card comprises a microcircuit 2 (microprocessor or memory, sometimes referred to as an "electronic chip") with a thickness less than or equal to 160 μm, i.e. thin enough to resist bending stresses applied to the card. The thickness of the microcircuit 2 is moreover greater than 120 μm in order to preserve sufficient stiffness.

Conductive bumps 6 are produced on the metallization lands 21 of the microcircuit 2 in order to provide contact with the antenna 8, as described hereinafter.

Two plastic material compensation layers 14 surround the support (flexible film 3); they are hot laminated on either side of the flexible film 3 carrying the antenna 8 and the microcircuit 2. The resulting structure 12 is referred to as the "prelaminate".

The microcircuit card also comprises two layers 16 printed on their external face, hot laminated on either side of the prelaminate 12, and possibly two transparent plastic material layers 18 covering the printed layers 16 to protect them, which can be laminated at the same time as them.

Alternatively, a transparent protection varnish can be used instead of these transparent plastic material layers.

An example of a fabrication process for this kind of microcircuit card is described next with reference to FIGS. 2 to 8.

Figure 2:
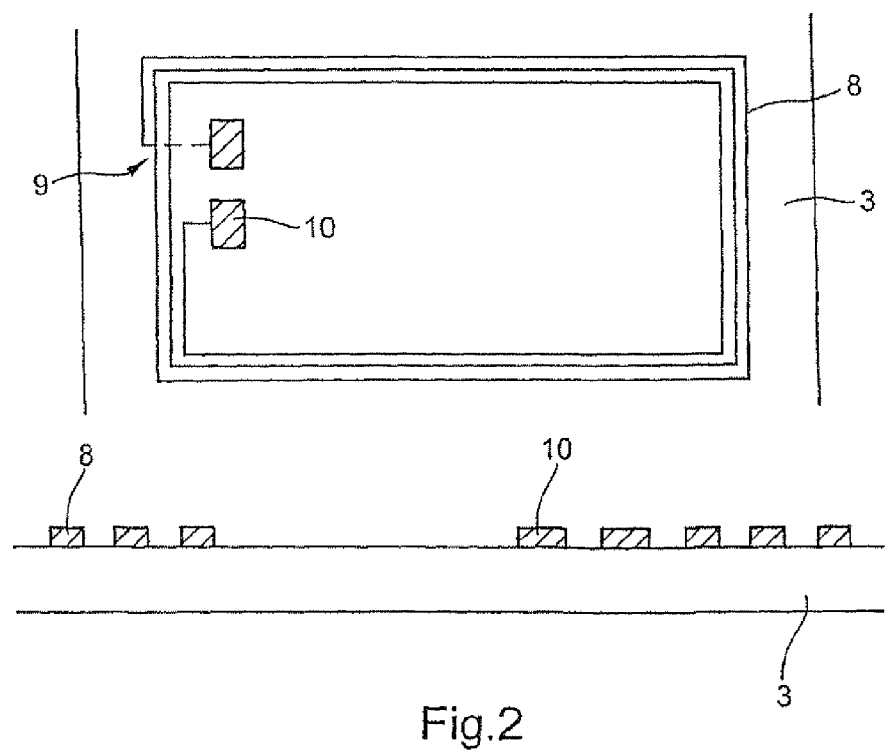

The first step is to produce the antenna 8 on the flexible film 3, for example by screenprinting conductive ink, by etching copper or aluminum, or by growing a conductive metal (usually copper) electrolytically. The structure represented in FIG. 2 is then obtained. The antenna has connecting lands 10 at its ends, as can be seen clearly in FIG. 2.

The production of the looping bridge 9 of the antenna 8 will not be described here in detail; it can be carried out in accordance with the teachings of patent application FR 2 769 390, for example.

Figure 3:
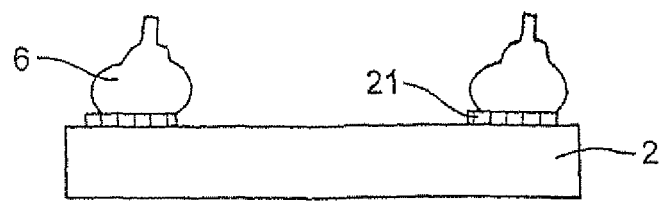

Conductive bumps 6 are deposited on the contact lands 21 of the microcircuit 2, as shown in FIG. 3. These conductive bumps 6 can be produced in various conductive metals or in a conductive polymer.

Bumps 6 produced by a thermosonic wire welding process, known as stud bumps, are preferably used in this process.

Figure 4:
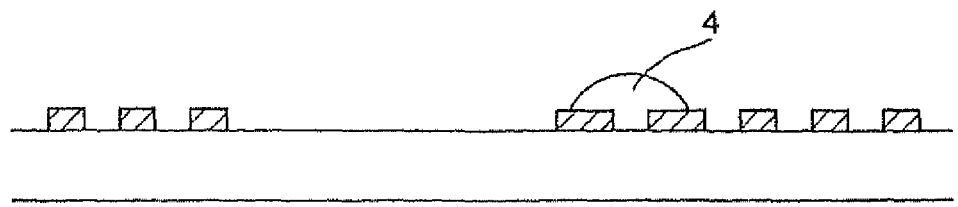

The insulative (or anisotropic) glue 4, for example a droplet thereof, is deposited on the location used to produce the contacts, as shown in FIG. 4.

This glue 4 is chosen such that its softening temperature (i.e. its glass transition temperature in the case of heat-set glues and amorphous structure thermoplastics) is relatively high so that the glue does not creep excessively during lamination (in particular during the application of the maximum pressure of the lamination cycle), thus breaking the connections between the antenna 8 and the microcircuit 2.

To this end, this softening temperature can be made not more than 40° less than the maximum temperature of the lamination cycle, for example.

Figure 5:
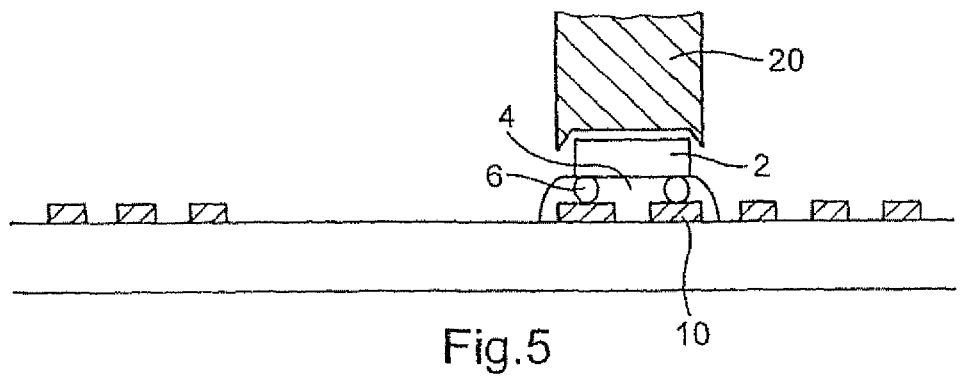

The bumps 6 are then pressed against the connecting lands 10 of the antenna 8, as shown in FIG. 5, using a heated head 20 for depositing the microcircuit 2 to enable fast hot polymerization or hardening of the glue 4.

Figure 6:
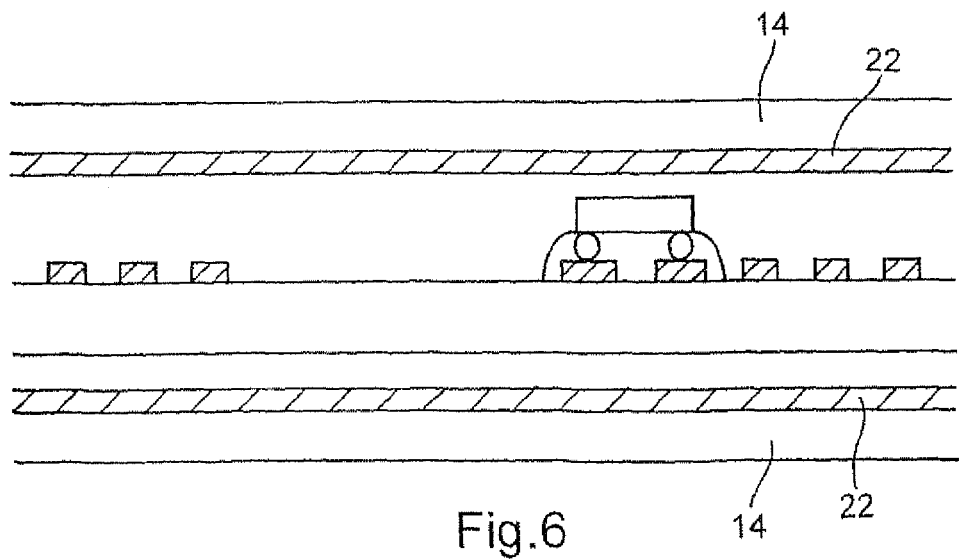

To prepare the operation of laminating the compensation layers 14, these compensation layers are first assembled to either side of the inlay formed by the flexible film 3, the antenna 8 and the microcircuit 2. A hot-melt adhesive 22 can be deposited beforehand, either on the two faces of the inlay or on the faces of the compensation layers 14, face to face with the inlay, as shown in FIG. 6.

Figure 11:
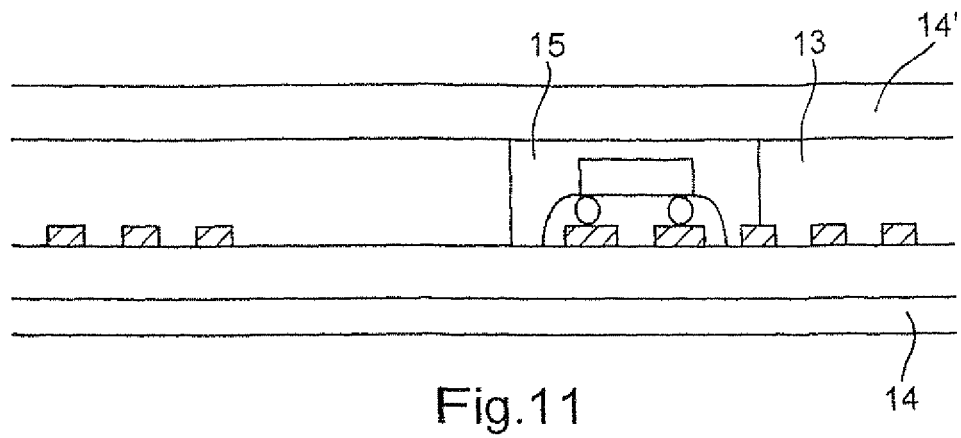
Figure 12:
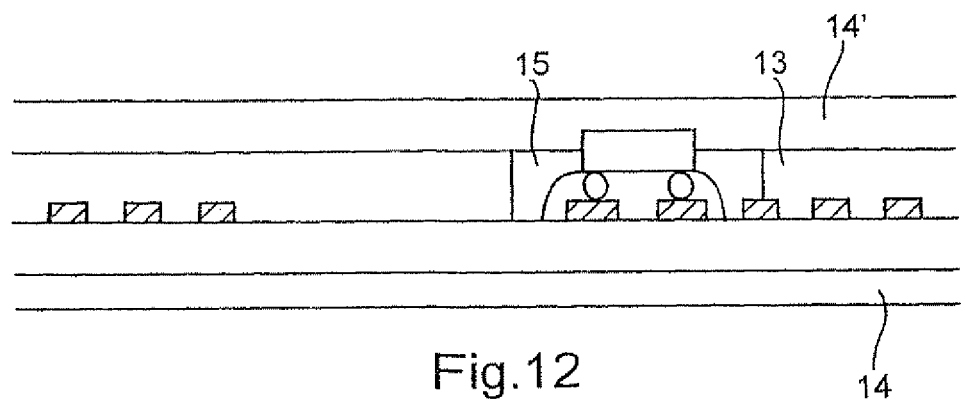
Figure 13:
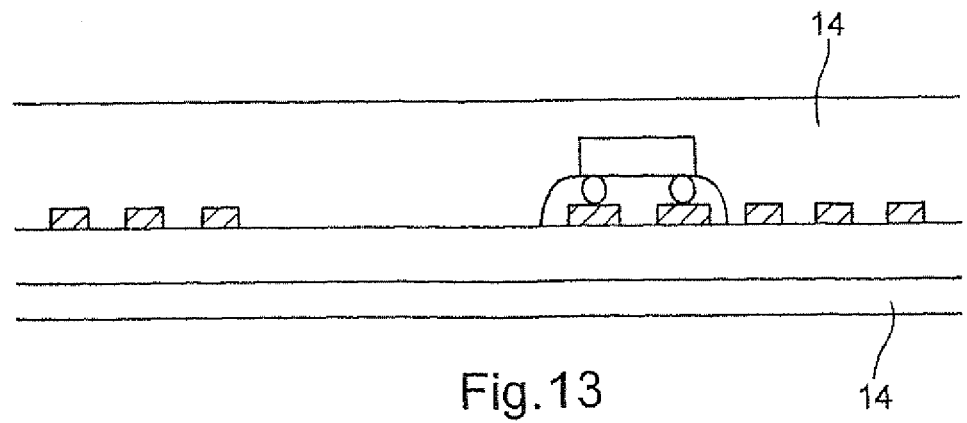

A number of structures can be used at this stage:
a perforated structure comprising a first layer 13, the thickness of which is greater than that of the microcircuit 8, perforated at the location of said chip, and a second layer 14' using a material having a softening temperature lower than that of the first layer 13 (FIG. 11); this layer 14' therefore fills the cavity 15 of the first layer 13 as a result of creep during lamination of the structure;
a semi-perforated structure, different from the structure described above in that the thickness of the first layer 13 is less than or equal to that of the microcircuit 2 (FIG. 12);
an unperforated structure with a material of low softening temperature (for example 59° VTCAT A) whose thickness before lamination is greater than that of the component (FIG. 13).

Figure 7:
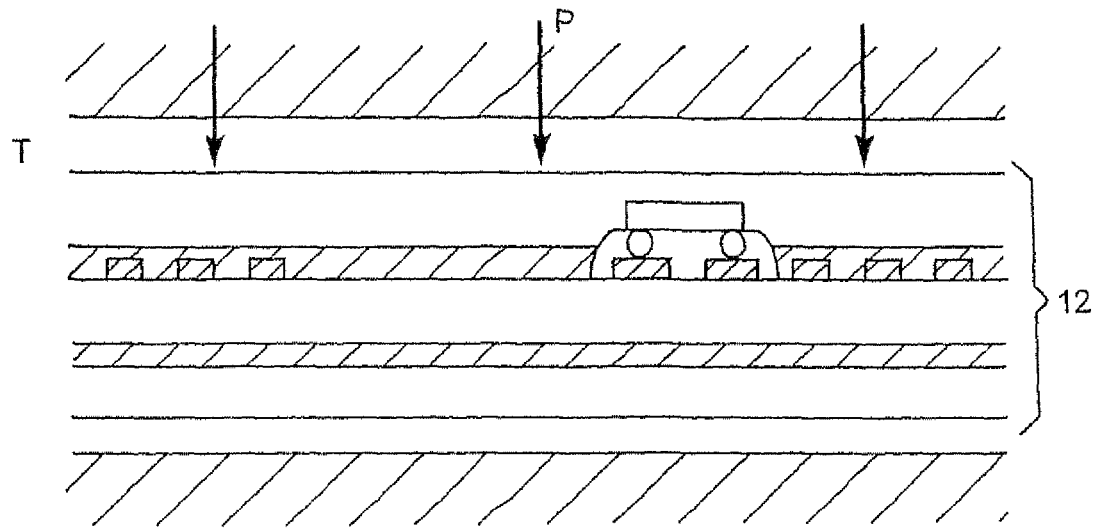

There then follows, as shown in FIG. 7, a cycle of lamination of the compensation layers, which includes a progressive increase in pressure P and a brief period (for example less than 4 minutes) at the maximum pressure P to avoid the risk of disconnection or breaking of the microcircuit 2.

Figure 8:
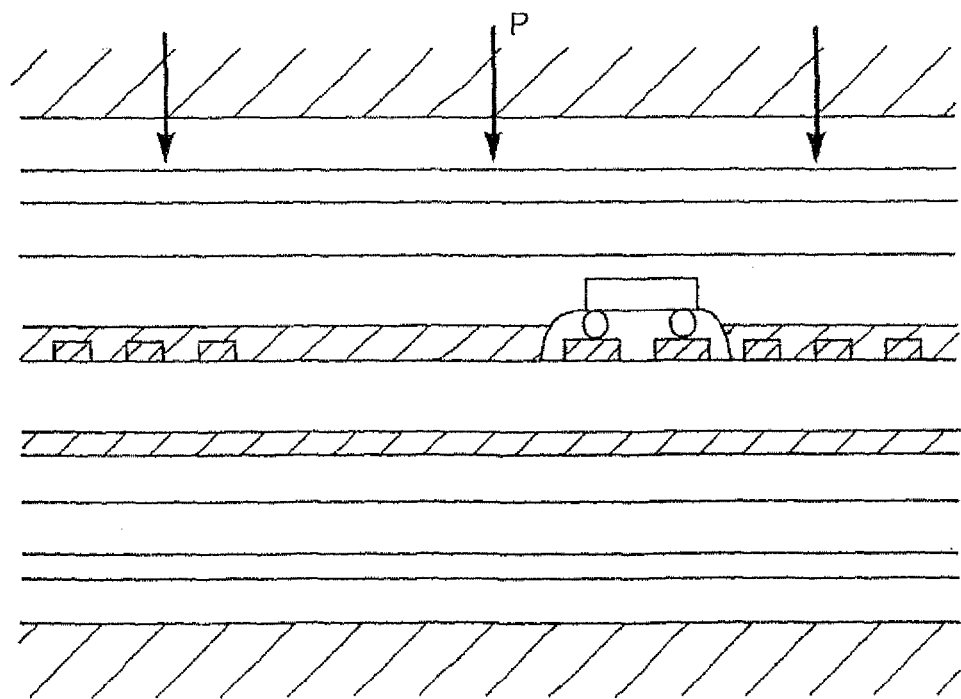

The prelaminate 12 produced in this way can then be assembled to the layers 16 carrying the printing and where applicable the transparent protection layers 18 (if a varnish is not used for this purpose), as shown in FIG. 8.

The assembly is then hot laminated at a maximum temperature, here of the order of 150° C. Thanks to the above choice of glue, this maximum temperature does not exceed by more than 40° C. the softening temperature of the glue.

Here the turns of the antenna 8 are also not located in the area 24 reserved for embossed characters defined by the ISO standard or specifications issued by banking organizations (such embossing areas 24 are conventionally between 4 mm and 23 mm from the bottom edge of the card, with lateral margins of the order of 5 mm).

Figure 9:
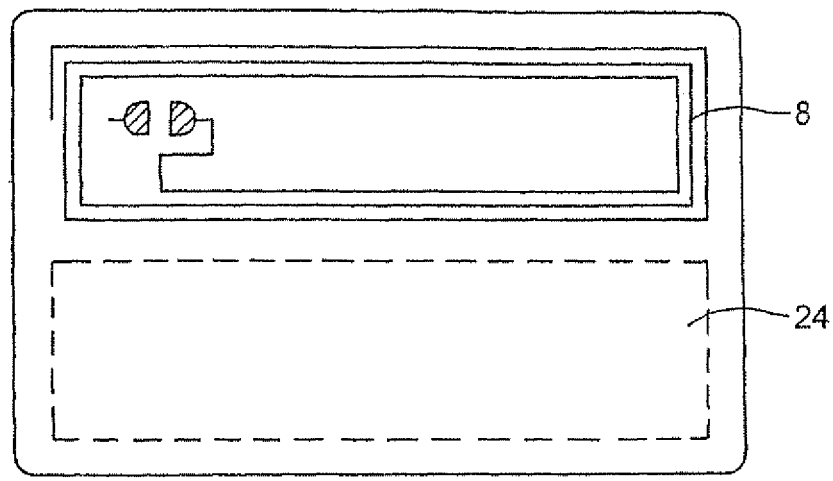

To this end, antennas can be produced in which the turns are located above said embossing area 24 in the plane of the card, as shown in FIG. 9. Such antennas are of shorter range, however, because of their small equivalent area.

Figure 10:
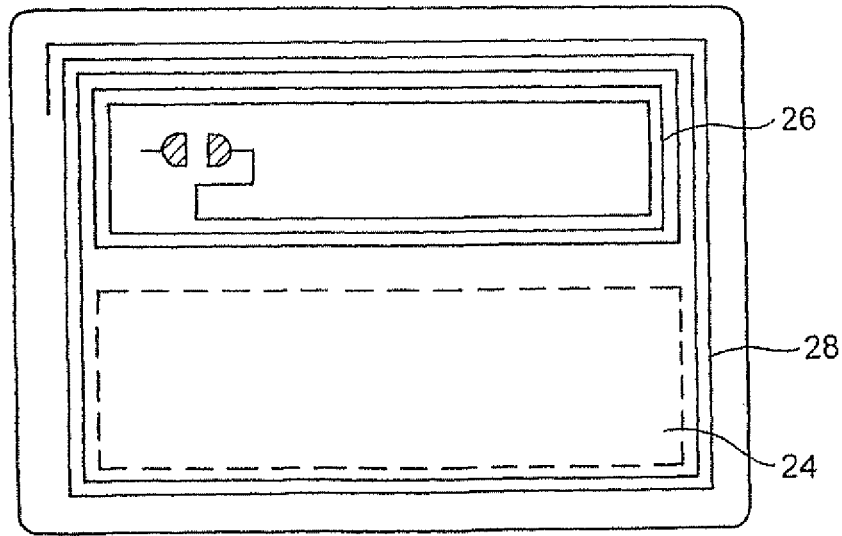

It is proposed here to produce some of the turns at the periphery of the card, passing under the embossing area 24 in the plane of the card, and the remainder above the embossing area 24, as shown in FIG. 10. This configuration maximizes the area inside the turns and thus optimizes the performance of the antenna (in particular its range).

The portion of the turns located above the embossing area (and thus in the region of the card that carries the microcircuit 2) therefore forms a first winding 26 consisting of a first number of turns, for example from two to five turns (three turns here). The portion of the turns located at the periphery of the card forms a second winding 28, connected in series with the first winding 26 and consisting of a second number of turns, for example two to five turns (here two turns).

The turns are produced as already mentioned in the form of conductive tracks, usually with a width between 0.1 mm and 0.4 mm, and separated from each other by a gap from 0.1 mm to 0.4 mm. The embodiments described hereinabove merely constitute possible examples of implementation of the invention, which is not limited to them.

The invention claimed is:

1. Microcircuit card comprising:
    a magnetic antenna (8) formed of a first winding (26) comprising at least one turn and a second winding (28) comprising at least one turn; and
    an embossing area (24) of the card outside the first winding (26) and inside the second winding (28),
    wherein the first winding (26) is located in a rectangular portion of the microcircuit card located outside the embossing area (24) and that has no embossing.

2. Microcircuit card according to claim 1, wherein the first winding (26) and the second winding (28) are connected in series.

3. Microcircuit card according to claim 2, wherein the second winding (28) is located at the periphery of the microcircuit card.

4. Microcircuit card according to claim 1, wherein the second winding (28) is located at the periphery of the microcircuit card.

5. Microcircuit card according to claim 1, wherein said rectangular portion carries a microcircuit (2).

6. Microcircuit card according to claim 1, further comprising a microcircuit inside the first and second windings.

7. Method of fabricating a microcircuit card, comprising the following steps:
    depositing the microcircuit (2) on a surface (3) carrying at least one connecting land (10) with an adhesive (4) between them;
    applying heat and pressure on the microcircuit; and
    after completing the step of applying heat and pressure, hot laminating with a given maximum temperature of at least one compensation layer (14) attached to said surface (3),
    wherein the adhesive (4) is viscous at said maximum temperature.

8. Fabrication method according to claim 7, wherein the softening temperature of the adhesive and said maximum temperature differ by 40° C. or less.

9. Fabrication method according to claim 8, wherein the softening temperature of the adhesive is lower than said maximum temperature.

10. Fabrication method according to claim 8, wherein the adhesive is a heat-set glue.

11. Fabrication method according to claim 8, wherein the microcircuit card has a thickness between 680 μm and 840 μm.

12. Fabrication method according to claim 8, wherein at least one contact (21) of the microcircuit (2) is located facing said connecting land (10) with a conductive member (6) disposed between them.

13. Fabrication method according to claim 7 wherein the softening temperature of the adhesive is lower than said maximum temperature.

14. Fabrication method according to claim 7, wherein the adhesive is a heat-set glue.

15. Fabrication method according to claim 14, wherein the softening temperature of the adhesive is equal to the glass transition temperature of the glue.

16. Fabrication method according to claim 7, wherein the microcircuit (2) has a thickness in a direction essentially perpendicular to said surface (3) of less than 160 μm.

17. Fabrication method according to claim 16, wherein said thickness is greater than 120 μm.

18. Fabrication method according to claim 7, wherein the microcircuit card has a thickness between 680 μm and 840 μm.

19. Fabrication method according to claim 7, wherein at least one contact (21) of the microcircuit (2) is located facing said connecting land (10) with a conductive member (6) disposed between them.

20. Fabrication method according to claim 7, wherein the step of applying heat and pressure polymerizes the adhesive.

21. Fabrication method according to claim 7, wherein the step of applying heat and pressure hardens the adhesive.

* * * * *